(12) United States Patent
Liao

(10) Patent No.: US 7,656,737 B2
(45) Date of Patent: Feb. 2, 2010

(54) PUMPING CIRCUIT FOR MULTIPLE NONVOLATILE MEMORIES

(75) Inventor: Chun-Yao Liao, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 94 days.

(21) Appl. No.: 12/110,435

(22) Filed: Apr. 28, 2008

(65) Prior Publication Data
US 2009/0225619 A1 Sep. 10, 2009

(30) Foreign Application Priority Data
Mar. 5, 2008 (TW) .............................. 97107600 A

(51) Int. Cl.
*G11C 7/00* (2006.01)

(52) U.S. Cl. ............. 365/226; 365/185.03; 365/185.18; 327/535; 327/536

(58) Field of Classification Search ................. 365/226, 365/185.18, 185.03; 327/535, 536
See application file for complete search history.

(56) References Cited

U.S. PATENT DOCUMENTS

| | | | |
|---|---|---|---|
| 5,909,396 A * | 6/1999 | Le et al. ................ 365/185.23 |
| 7,345,916 B2 * | 3/2008 | Yang et al. ............. 365/185.14 |
| 2008/0018380 A1 * | 1/2008 | Campardo et al. .......... 327/536 |
| 2008/0024198 A1 * | 1/2008 | Bitonti et al. ............... 327/536 |
| 2008/0054991 A1 * | 3/2008 | Maejima ..................... 327/536 |

* cited by examiner

*Primary Examiner*—Tuan T Nguyen
*Assistant Examiner*—Toan Le
(74) *Attorney, Agent, or Firm*—WPAT, PC; Justin King

(57) ABSTRACT

A pumping circuit for multiple nonvolatile memories, comprising: a high voltage source; and a high voltage pass block with a gate controlled by a local booster to introduce the high voltage source into a plurality of nonvolatile memories for erase/write operation.

9 Claims, 3 Drawing Sheets

PUMPING CIRCUIT FOR MULTIPLE NONVOLATILE MEMORIES

BACKGROUND OF THE INVENTION

1. Field of the Invention

The present invention generally relates to a pumping circuit for multiple nonvolatile memories and, more particularly, to a pumping circuit for an integrated circuit (IC) comprising a plurality of electrically erasable nonvolatile storage devices such as electrically erasable programmable read-only memories (EEPROM's) and flash memories. The pumping circuit uses a common voltage pump to provide a plurality of nonvolatile storage devices with a high voltage source so as to minimize the layout area and the cost.

2. Description of the Prior Art

As electrically erasable nonvolatile storage devices a plurality of electrically erasable nonvolatile storage devices such as electrically erasable programmable read-only memories (EEPROM's) and flash memories perform write/erase operations, a high-voltage source is required. Generally, a high voltage supplying circuit is used as a voltage pump to perform the write/erase operations.

When at least two electrically erasable nonvolatile storage devices with different functions are disposed in an IC, the IC generally comprises at least two voltage pumps because the high-voltage source is varied for different output conditions.

This kind of voltage pump provides the high voltage only when the nonvolatile storage devices perform write/erase operations. In an IC, the nonvolatile storage devices mostly perform read operation and thus the voltage pump idles for most of the time. Moreover, the voltage pump occupies a considerable amount of the layout area and the manufacturing cost is high.

Therefore, there exists a need in providing a pumping circuit for multiple nonvolatile memories using a common voltage pump to provide a plurality of nonvolatile storage devices with a high voltage source so as to minimize the layout area and the cost.

SUMMARY OF THE INVENTION

It is one object of the present invention to provide a pumping circuit for multiple nonvolatile memories, which is used for an integrated circuit (IC) comprising a plurality of electrically erasable nonvolatile storage devices such as electrically erasable programmable read-only memory (EEPROM), flash memory. The pumping circuit uses a common voltage pump to provide a plurality of nonvolatile storage devices with a high voltage source so as to minimize the layout area and the cost.

It is another object of the present invention to provide a method for controlling a high voltage pass block to switch between a plurality of voltage sources in a multi-power circuit.

In order to achieve the foregoing object, the present invention provides a pumping circuit for multiple nonvolatile memories, comprising:

a high voltage source; and
a high voltage pass block with a gate controlled by a local booster to introduce the high voltage source into a plurality of nonvolatile memories for erase/write operation.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE PREFERRED EMBODIMENT

The present invention can be exemplified by the preferred embodiment as described hereinafter.

Figure 1:
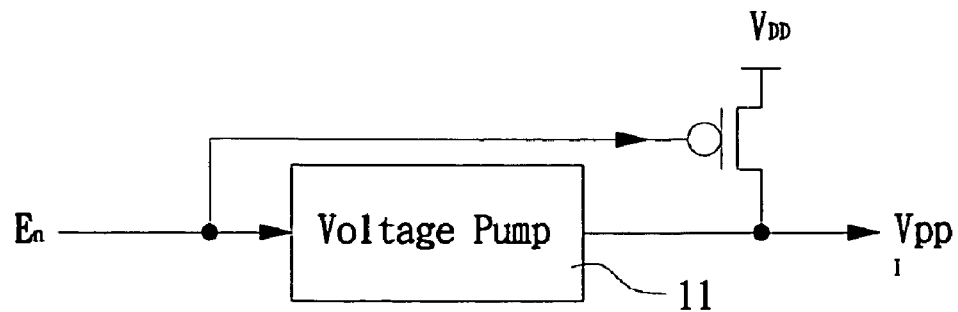
FIG. 1 is a pumping circuit comprising a voltage pump for a single nonvolatile memory according to the present invention.

Please refer to FIG. 1, which is a pumping circuit comprising a voltage pump for a single nonvolatile memory according to the present invention. Conventionally, the voltage pump in an electrically erasable nonvolatile storage device provides the high voltage only when the nonvolatile storage devices perform write/erase operations. The nonvolatile storage device mostly performs read operations and thus each of the voltage pumps is off and the high-voltage source is represented as $V_{DD}$, which is no higher than 5.5 volts. Therefore, there is no need for installing a DC voltage converter and thus the circuitry is simple.

Figure 2:
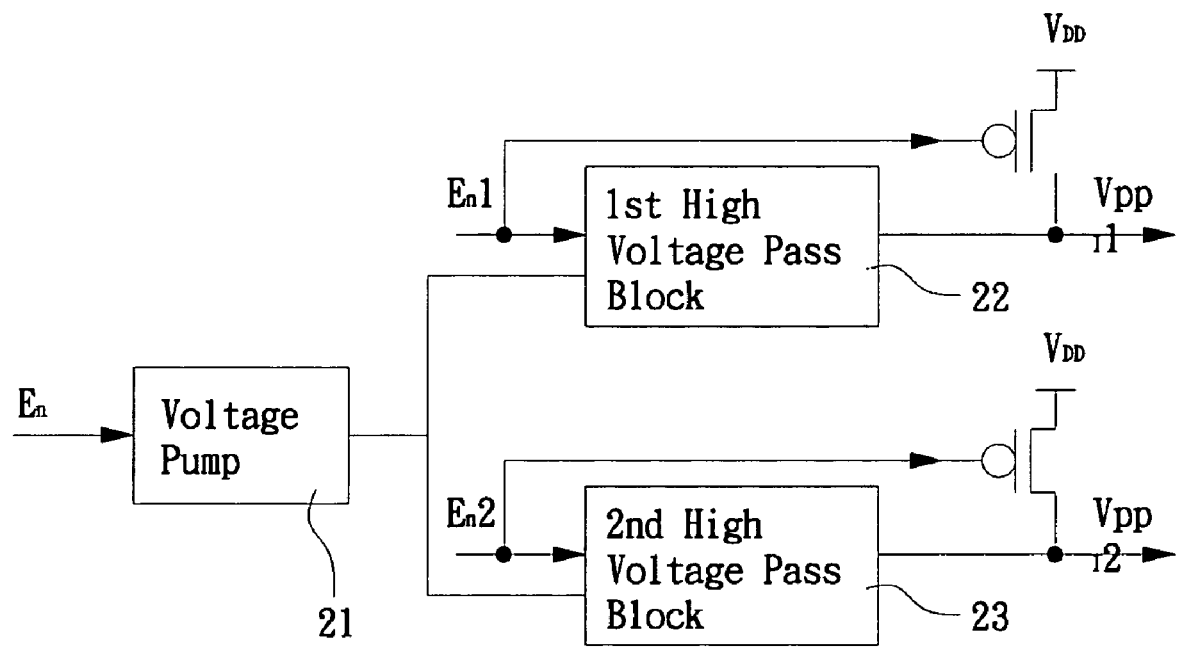
FIG. 2 is a pumping circuit comprising a voltage pump for a plurality of nonvolatile memories according to the present invention.

Please refer to FIG. 2, which is a pumping circuit comprising a voltage pump for a plurality of nonvolatile memories according to the present invention. The pumping circuit comprises a voltage pump 21, a first high voltage pass block 22, and a second high voltage pass block 23. The voltage pump is independently disposed and is used as a common voltage pump for at least two electrically erasable nonvolatile storage devices. In the voltage pump, a voltage source switch (not shown) for switching a first enable signal and a second enable signal to introduce the voltage source from the voltage pump 21. The first high voltage pass block 22 and the second high voltage pass block 23 are switched to determine whether the first output high voltage $V_{PP1}$ or the second output high voltage $V_{PP2}$ is to be activated. In this case, the voltage pump 21 is not only for a nonvolatile storage device but a plurality of nonvolatile storage devices, and uses a voltage source switch to provide the plurality of nonvolatile storage devices with high-voltage sources.

Figure 3:
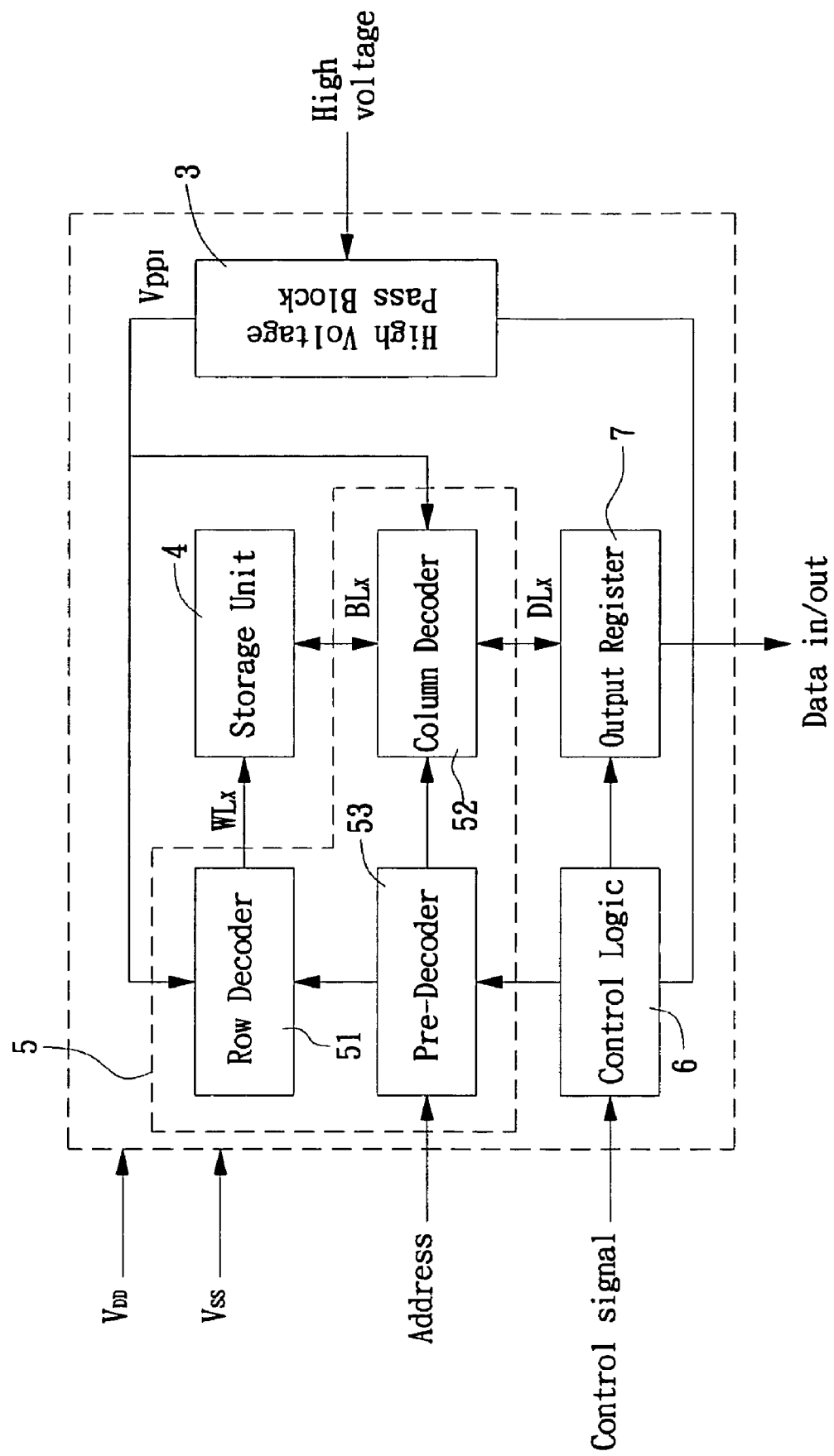
FIG. 3 is a circuit diagram of a nonvolatile memory using a high voltage pass block according to the present invention.

Please refer to FIG. 3, which is a circuit diagram of a nonvolatile memory using a high voltage pass block according to the present invention. The circuit diagram comprises: a high voltage pass block 3, a storage unit 4, a decoding unit 5, a control logic 6, and an output register 7. The decoding unit 5 further comprise: a row decoder 51, a column decoder 52, and a pre-decoder 53. When the nonvolatile storage devices perform write/erase operations, a high-voltage from the high voltage pass block 3 is introduced to the storage unit 4 when the word line (WLx) and the bit line (BLx) are at different modes so that the storage unit 4 changes the Vt (corresponding to the column and row data) to achieve write/erase operations.

In order for the nonvolatile storage devices to share a common voltage pump, the conventional nonvolatile storage device is modified. In the present invention, the high voltage pass block 3 is used instead of a conventional voltage pump so that the nonvolatile storage devices are similar to EEPROM's. To introduce the high voltage into each of the electrically erasable nonvolatile storage devices when performing write/erase operations, a high voltage pass block 3 is added in the high-voltage path so that the high voltage source from the voltage pump is introduced to perform write/erase operations.

Figure 4:
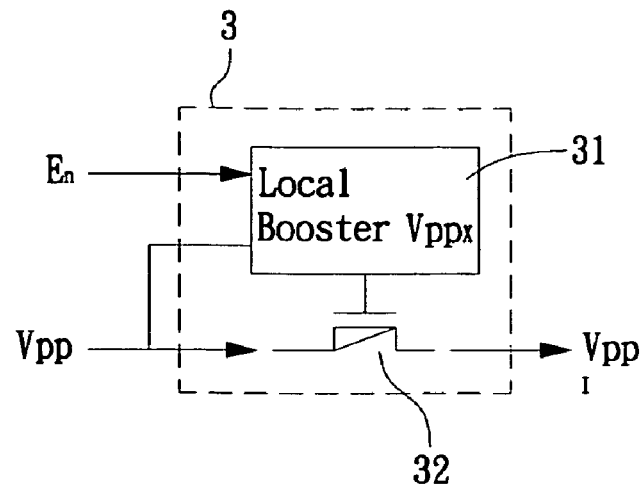
FIG. 4 is a circuit diagram of a high voltage pass block according to the present invention.
Figure 5:
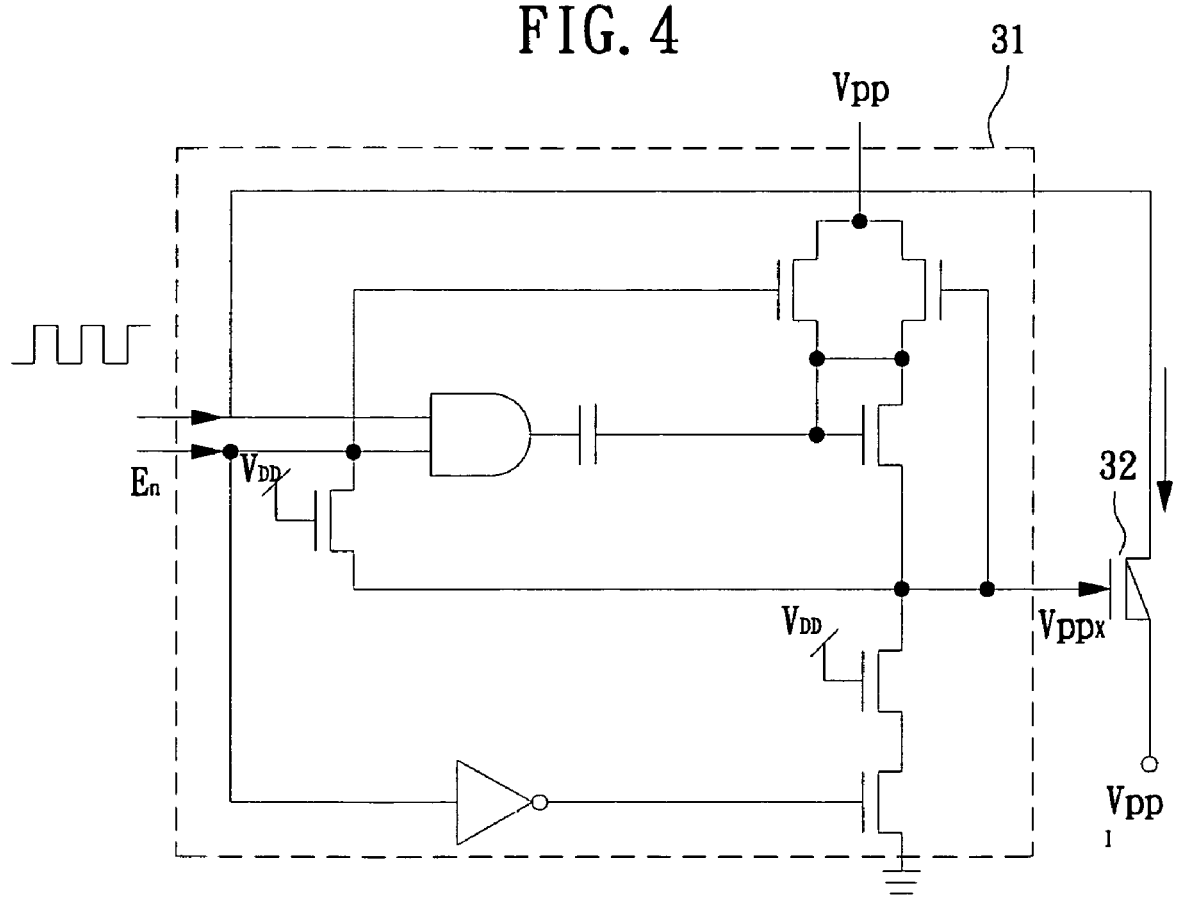
FIG. 5 is a detailed circuit diagram of a high voltage pass block in FIG. 4.

Please refer to FIG. 4 and FIG. 5, which show a high voltage pass block according to the present invention. The high voltage pass block 3 is used as a pass gate to introduce the output high voltage $V_{PPI}$ from the voltage pump when the nonvolatile storage device requires a high voltage $V_{PP}$ to perform write/erase operations. The pass gate is turned off when the nonvolatile storage device is reading.

In the present embodiment, a high-voltage n-channel MOSFET is used as a main portion of the pass gate, wherein the gate is controlled by the gate voltage $V_{PPX}$ of a local booster 31. The local booster 31 comprises a plurality of MOSFET's and logic gates. When the nonvolatile storage device is required to perform write/erase operations, the local booster 31 is enabled so that the output high voltage $V_{PPI}$ is able to turn on the high-voltage n-channel MOSFET of the pass gate. Meanwhile, the high-voltage $V_{PP}$ from voltage pump is introduced into the output high voltage $V_{PPI}$ of the nonvolatile storage device.

When a local booster 31 uses the output high voltage $V_{PP}$ from a voltage pump as a voltage source, the voltage from the local booster 31 is mostly higher than the output high voltage $V_{PP}$. Therefore, the output high voltage $V_{PP}$ can be introduced to the nonvolatile storage device that requires a high voltage.

In the present invention, when at least two electrically erasable nonvolatile storage devices with different functions are disposed in an IC, a high-voltage source is available and the layout area for the voltage pump is reduced.

The present invention is advantageous over the prior art in that:

(a) the voltage pump for the electrically erasable nonvolatile storage device is independently provided and adopted for introducing high-voltage sources;

(b) a high voltage pass block is used to introduce the high-voltage source to the electrically erasable nonvolatile storage device;

(c) the layout area of the voltage pump is reduced when at least two electrically erasable nonvolatile storage devices are used.

Accordingly, the present invention discloses a pumping circuit for multiple nonvolatile memories using a common voltage pump to provide a plurality of nonvolatile storage devices with a high voltage source so as to minimize the layout area and the cost. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A pumping circuit for multiple nonvolatile memories, comprising:
    a charge pump, for pumping up a first voltage to be a second voltage;
    a first high voltage pass block, coupled to an output port of said charge pump, for receiving a first enabling signal and outputting the second voltage for one of the nonvolatile memories when the first enabling signal is activating;
    a first PMOS, coupled to an output port of said first high voltage pass block, for receiving the first enabling signal and outputting the first voltage for the one of the nonvolatile memories when the first enabling signal is deactivating;
    a second high voltage pass block, coupled to the output port of said charge pump, for receiving a second enabling signal and outputting the second voltage for another one of the nonvolatile memories when the second enabling signal is activating;
    a second PMOS, coupled to an output port of said second high voltage pass block, for receiving the second enabling signal and outputting the first voltage for the another one of the nonvolatile memories when the second enabling signal is deactivating;
    a voltage source switch, for switching the first and the second enabling signals to introduce the first voltage and the second voltage to said non-volatile memories;
    wherein said first and second high voltage pass block further respectively comprises a local booster and a gate controlled by the local booster; and
    wherein, said first voltage is lower than said second voltage.

2. The pumping circuit for multiple nonvolatile memories as recited in claim 1, wherein the local booster is turned on/off by a high-voltage n-channel MOSFET (metal-oxide-semiconductor field-effect transistor).

3. The pumping circuit for multiple nonvolatile memories as recited in claim 1, wherein the first voltage is a normal operation voltage $V_{DD}$.

4. The pumping circuit for multiple nonvolatile memories as recited in claim 1, wherein the first voltage is no higher than 5.5 volts.

5. The pumping circuit for multiple nonvolatile memories as recited in claim 1, wherein the local booster comprises a plurality of MOSFET's and logic gates.

6. The pumping circuit for multiple nonvolatile memories as recited in claim 1, wherein the plurality of nonvolatile memories further comprise a storage unit, a decoding unit, a control logic and an output register.

7. The pumping circuit for multiple nonvolatile memories as recited in claim 6, wherein the decoding unit further comprises a row decoder, a column decoder and a pre-decoder.

8. The pumping circuit for multiple nonvolatile memories as recited in claim 1, wherein when the first enabling signal is activating, the nonvolatile memory coupled to the first high voltage pass block is in erase/write operation.

9. The pumping circuit for multiple nonvolatile memories as recited in claim 1, wherein when the first enabling signal is deactivating, the nonvolatile memory coupled to the first high voltage pass block is in read operation.

* * * * *